United States Patent [19]
Cronin et al.

[11] Patent Number: 5,861,658
[45] Date of Patent: Jan. 19, 1999

[54] INORGANIC SEAL FOR ENCAPSULATION OF AN ORGANIC LAYER AND METHOD FOR MAKING THE SAME

[75] Inventors: John Edward Cronin, Milton, Vt.; Barbara Jean Luther, Cold Spring, N.Y.

[73] Assignee: International Business Machines Corporation, Armonk, N.Y.

[21] Appl. No.: 724,877

[22] Filed: Oct. 3, 1996

[51] Int. Cl.⁶ ...................................................... H01L 39/12
[52] U.S. Cl. ............................................... 257/499; 216/2
[58] Field of Search .................................. 257/499; 216/2

[56] References Cited

U.S. PATENT DOCUMENTS

| | | | |
|---|---|---|---|
| 4,495,220 | 1/1985 | Wolf et al. | 427/82 |
| 5,126,290 | 6/1992 | Lowrey et al. | 437/235 |
| 5,284,801 | 2/1994 | Page et al. | 437/195 |
| 5,294,295 | 3/1994 | Gabriel | 156/657 |
| 5,318,950 | 6/1994 | Etrillard | 505/329 |
| 5,356,834 | 10/1994 | Sugimoto et al. | 437/190 |
| 5,472,900 | 12/1995 | Vu et al. | 437/60 |

*Primary Examiner*—Susan A. Loring
*Attorney, Agent, or Firm*—Schmeiser, Olsen & Watts; Mark F. Chadurjian

[57] ABSTRACT

An inorganic seal for encapsulation of an organic layer during passivation of an integrated circuit device and method for making the same is disclosed. The seal creates a structure which forms an inorganic to inorganic passivation seal over Reactive Ion Etched (RIE) edges in an all organic planar back end of the line (BEOL) insulator. The edge seal prevents the delamination of the passivation layer from the integrated circuit device or a metallization ring which may lead to subsequent formation of moisture-filled channels and corrosion of the metal lines of the device and the failure of the integrated circuit.

7 Claims, 5 Drawing Sheets

INORGANIC SEAL FOR ENCAPSULATION OF AN ORGANIC LAYER AND METHOD FOR MAKING THE SAME

TECHNICAL FIELD

This invention relates generally to semiconductor processing, and more particularly to the area of final passivation during semiconductor processing for an integrated circuit device.

BACKGROUND OF THE INVENTION

The processing of a semiconductor wafer is divided into various groups of steps normally referred to as: the front-end-of-the-line (FEOL); middle-of-the-line (MOL) and back-end-of-the-line (BEOL). One of the final steps at the BEOL in the wafer processing is applying a protective passivation layer on the entire wafer. The passivation step includes the deposition of a protective passivation layer over the integrated circuit (IC) device. The function of the passivation layer is mechanical, to protect the processed wafer from the environment during transportation, handling, and final packaging. An edge seal is a region between the active chip area and the dicing channel that is susceptible to moisture damage. Moisture damage can alter the electrical properties of the integrated circuitry of the individual IC chips on the wafer, thus leading to device failure. Eventually, passivation areas are removed forming dicing regions to allow dicing the wafer into individual IC chips.

When the BEOL is formed using organic insulators like polyimide formed on the silicon insulator surface, a difficulty arises when this polyimide passivation layer, peels (delaminates) or cracks at the edge seal region due to stress. During final wafer processing of the polyimide passivation layer, the layer is etched by a process such as reactive ion etching (RIE) to open terminal via (TV) pads over the metal landing pads and edge seal channel regions to the silicon insulator. The edge seal channels are exposed silicon insulator locations not covered with polyimide which will eventually be diced. Uncovered edge seal channels of the passivation layer become problematic. For example, an edge of a polyimide passivation layer etched by RIE may absorb up to 15 percent more moisture on its RIE etched edges; as compared with the bulk polyimide passivation regions. This causes the edges to swell and ultimately delaminate from the silicon insulator. As the edges delaminate, capillary-like separations are formed between the passivation layer and the silicon insulator, providing a site for moisture to aggregate, creating moisture-filled channels within the IC device. These channels allow ions to move freely about and hence are drawn into the active chip area, which inevitably leads to corrosion within the IC device and ultimately failure.

Heretofore, various methods have been proposed for protecting the etched edges of a passivation layer from delamination by peeling or cracking. For example, one method proposed application of a second polyimide layer over the edge of a first polyimide passivation layer etched by RIE. The second polyimide layer is then wet etched to reopen the channel as well as the TV pads. A disadvantage of this method is that it is (A) more time-consuming and, (B) expensive, and (C) impacts layout ground rules as it requires the use of an additional mask to perform the wet etch. Therefore, there exists a need for an improved passivation layer edge seal for an integrated circuit device.

SUMMARY OF THE INVENTION

The present invention includes an inorganic insulator, such as a nitride or oxide, encasing an organic passivation structure, such as polyimide, and method for providing the inorganic insulator with FEOL, MOL and BEOL levels. BEOL layers are formed in organic passivation layers, such as polyimide. The BEOL layer is covered by a layer of an inorganic such as nitride or oxide, which is then covered with a final organic mechanical passivation layer. The mechanical passivation layer is etched to form openings, exposing BEOL metal pads and the regions to form dicing channels. The edges of the BEOL layers in the metal pad and dicing channel regions are covered with an inorganic insulator, such as a nitride or oxide, thus forming an inorganic encapsulation of BEOL organic polyimide.

The passivation layers and edge seal and method for making the same saves both time and expense over existing methods as it does not require the use of an additional mask and wet etch. Furthermore, the method provides high density edge seal definition, in contrast to the much larger edge seal which results from wet etching.

Numerous other advantages and features of the present invention will become readily apparent from the following detailed description of the preferred embodiment, the accompanying drawings and the appended claims.

BRIEF DESCRIPTION OF THE DRAWINGS

The invention is described in greater detail hereinafter, with reference to non-limitative embodiments and with reference to the accompanying drawings, wherein like reference numerals refer to like elements throughout and wherein.

DETAILED DESCRIPTION OF THE PREFERRED EMBODIMENT

This invention has been described in terms of specific embodiments, set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate. It should be understood that when defining the interrelationship of layers, the term "over" or "covered"

means that the lamination layers are positioned proximate one another, but may or may not be in contact with one another. For example, if a first layer is said to be positioned "over" a second layer, a third layer may or may not be positioned between the first and second layers. It should be understood that the term "layer" may indicate a region of the chip that is built up by various processing steps.

Figure 1:
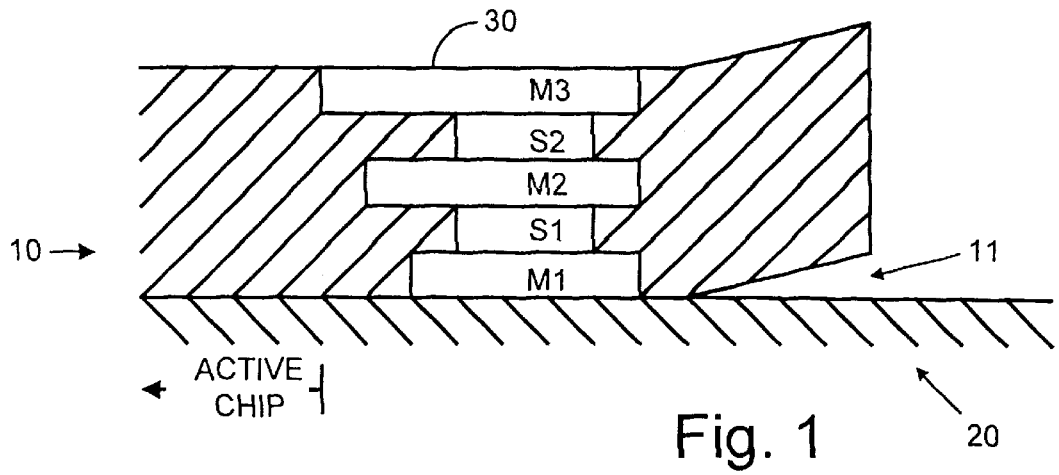
FIG. 1 is a schematic representation of an integrated circuit (IC) device structure showing delamination of a planar passivation layer from the IC insulator.
Figure 9:
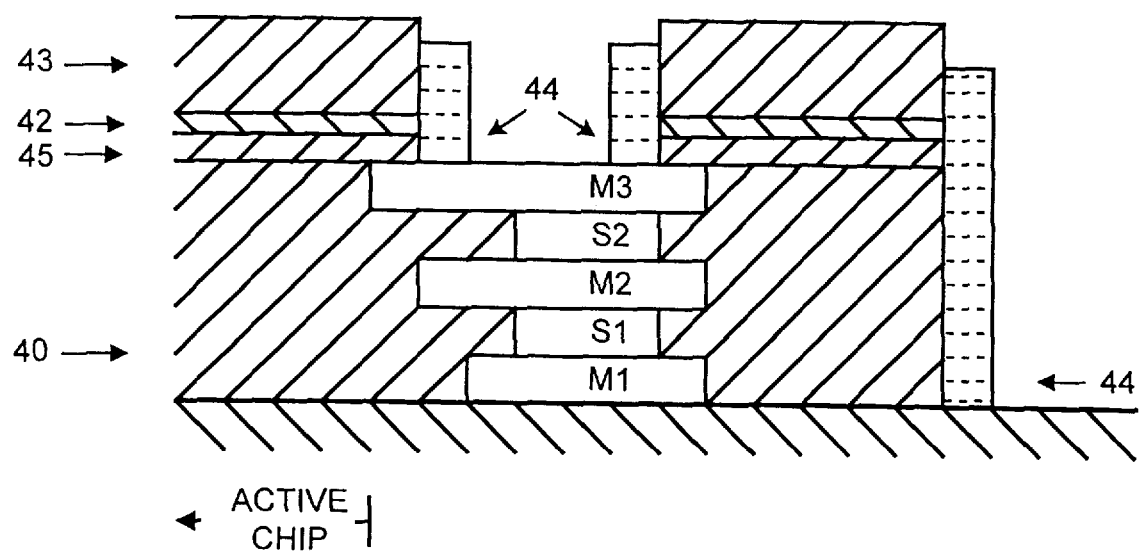
FIG. 9 is a schematic representation of passivation of an alternate embodiment of an IC device following etching.

Referring to FIG. 1, the present invention addresses delamination 11 of the passivation layers 10 where the passivation layers include a metallization ring 30, M3, S2, M2, S1, M1, from an inorganic layer, such as a silicon dioxide ($SiO_2$) inorganic glass insulator layer 20, jeopardizing the active chip. Further, this invention addresses delamination in the metal pad region M3, S2, M2, S1, M1. Referring to FIG. 9, organic insulator 45 will delaminate from M3, 40 (similar to FIG. 1) if a seal 44 is not provided.

Figure 2:
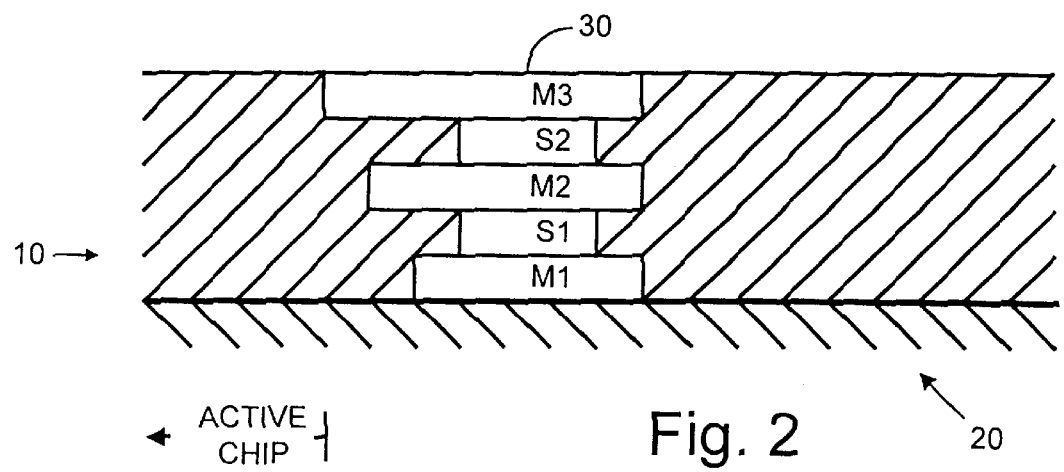
FIG. 2 is a schematic representation of passivation of an IC device following deposition of an organic layer on an inorganic insulator.
Figure 3:
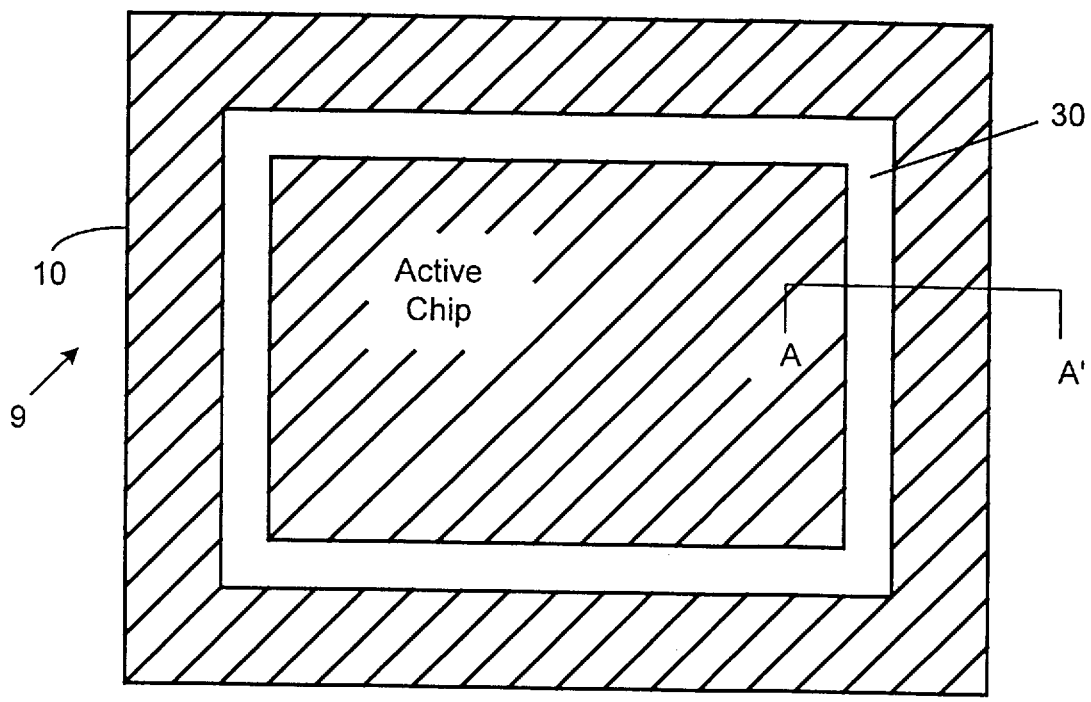
FIG. 3 is a top view of FIG. 2.

With reference to FIG. 3, a top view of an active chip is shown at 9. FIG. 2 is a cross-section of the chip 9 as taken through lines A—A' in FIG. 3. In FIG. 2, the BEOL has been defined by any of a number of methods normally used in the semiconductor industry. Metal levels M3, M2, M1 are defined during the process with stud metal connectors S2, S1 which act as a metal "guard ring" 30 around the active chip.

Figure 4:
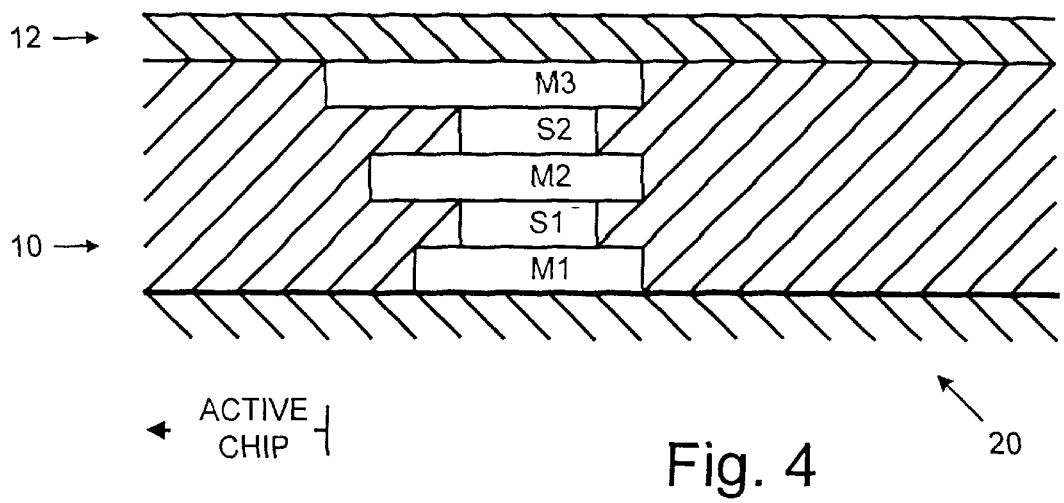
FIG. 4 is a schematic representation of passivation of an IC device following the deposition of an inorganic layer on the organic layer.

With reference to FIG. 4, a layer 12 of an inorganic insulator, such as silicon dioxide, nitride, silicon nitride, silicon oxynitride, or silicon boronitride, is deposited over an organic polyimide layer 10 by chemical vapor deposition (CVD). Preferably a silicon dioxide or silicon nitride is used ($\leq 350°$ C. temperature) so as to be compatible with the polyimide organic.

Figure 5:
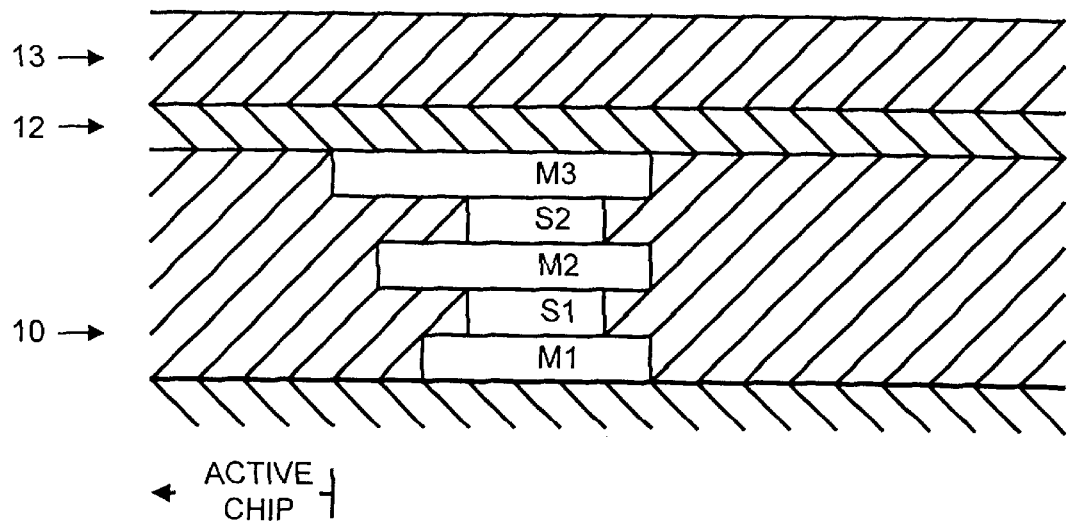
FIG. 5 is a schematic representation of passivation of an IC device following the deposition of another organic layer on the inorganic layer.

Referring to FIG. 5, a layer 13 (approximately 2 microns thick) of organic polyimide layer is used. The organic layer 10 and organic layer 13 are generally the same material. The advantage of using the same material is ease of manufacturing.

Figure 6:
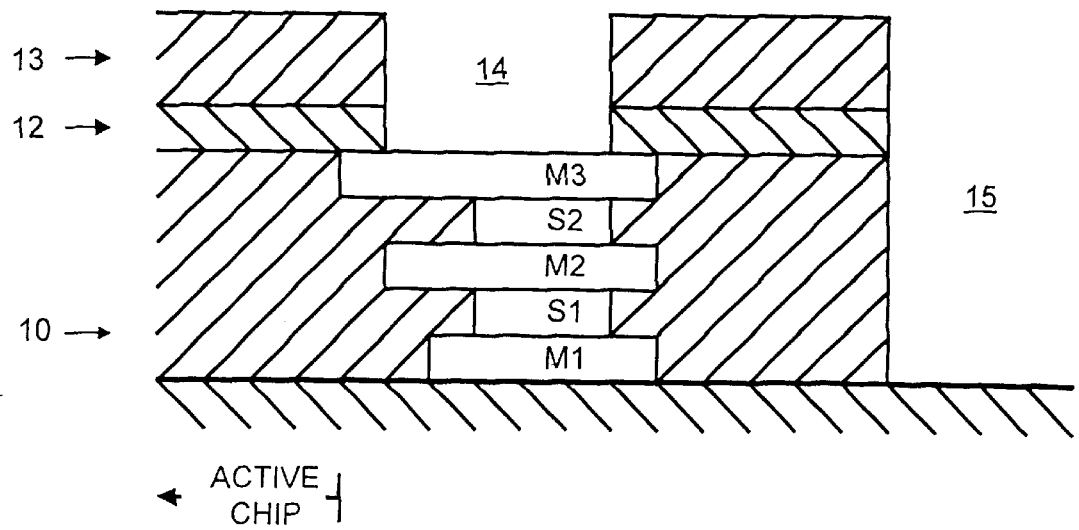
FIG. 6 is a schematic representation of passivation of an IC device following etching to define a terminal via (TV) pad and an edge seal channel.

As shown in FIG. 6 a photo resist mask (not shown) is used to open openings 14 to M3 of metallization ring 30 and edge seal channel region 15. In a preferred technique, a thin layer of radiation sensitive material or photo resist (not shown) is deposited over the organic layer 13. The photo resist is then exposed to a flux of energetic particles (photons, electrons, x-rays, or ions) containing the patterned information. The exposed coating is dissolved leaving openings 14, 15. The layers are then etched by preferably a dry etching, such as $O_2$ Reactive Ion Etching (RIE).

Figure 7:
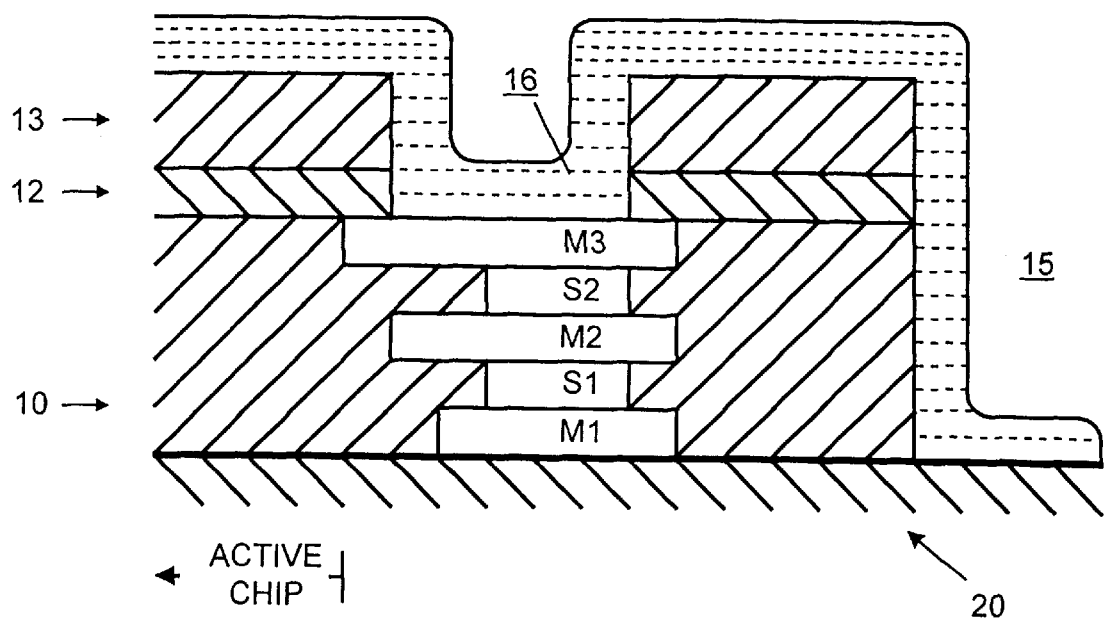
FIG. 7 is a schematic representation of passivation of an IC device following the deposition of a second inorganic layer.

As shown in FIG. 7, a layer 16 of an inorganic material, preferably silicon dioxide or silicon nitride is deposited by CVD conformal deposition. It is important that the layer 16 chemically bonds with the layer 12 and to starting insulator 20, both of which are inorganic to prevent delamination of the passivation layer 10. Thus, a silicon dioxide ($SiO_2$) layer 16 is preferred to chemically bond with $SiO_2$ layer 12.

Figure 8:
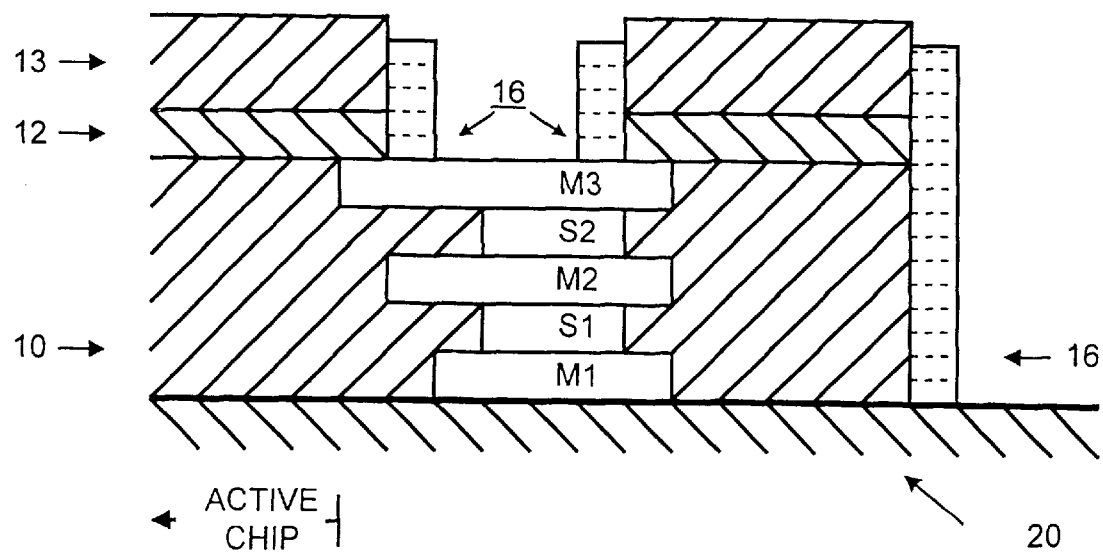
FIG. 8 is a schematic representation of passivation of an IC device following etching.

As shown in FIG. 8, the layer 16 is etched, preferably by RIE to form a seal, encapsulating organic 10 with an inorganic, such as $SiO_2$ 12, 16, 20. The wafer can then be handled and/or transported. Subsequently, the wafer may be diced between the stacks to yield the individual IC chips and the passivation layer will not experience delamination.

Referring to FIG. 9, an alternate IC chip layering is shown. Instead of a single inorganic insulator 12 being deposited over organic layer 10 as shown in FIG. 1, a layer of an organic layer 45, such as polyimide, and inorganic layer 42, such as oxide, (e.g., silicon dioxide), nitride, silicon nitride, silicon oxynitride, or silicon boronitride are deposited onto organic layer 40 and metallization ring M3. At the location where the organic layer 45 contacts the ring M3, delamination may occur similar to 11 in FIG. 1. This delamination is prevented by inorganic seal 44. The inorganic seal 44 bonds, to provide an inorganic-to-inorganic seal, with the metallization ring M3 and inorganic layer 42 to prevent delamination.

Although this invention is susceptible to an embodiment in many different forms, preferred embodiments of the invention are shown. It should be understood, however, that the present disclosure is to be considered as an exemplification of the principles of this invention and is not intended to limit the invention to the embodiments illustrated.

We claim:

1. An integrated circuit device comprising:
    a first layer of an inorganic insulator;
    a layer of an organic insulator deposited over said first layer;
    a second layer of an inorganic insulator deposited over said layer of organic insulator; and
    an inorganic insulator seal encapsulating said layer of said organic insulator between said first layer and said second layer.

2. The integrated circuit device of claim 1, wherein said organic insulator is polyimide.

3. The integrated circuit device of claim 1, wherein said first and second layers of inorganic insulator are selected from the group consisting of silicon dioxide and silicon nitride.

4. The integrated circuit device of claim 1, further comprising a second layer of organic insulator deposited on said second layer of said inorganic insulator.

5. An integrated circuit device comprising:
    an active chip region, including:
        a first layer of an inorganic insulator,
        a layer of an organic insulator deposited over said first layer, and
        a second layer of an inorganic insulator deposited over said organic insulator;
    a metallization ring surrounding said active chip region; and
    an inorganic seal for sealing said inorganic insulator layer to said metallization ring, wherein said organic insulator is encapsulated by said inorganic insulator seal.

6. The integrated circuit device of claim 5, wherein said layer of inorganic insulator is silicon dioxide or silicon nitride.

7. The integrated circuit device of claim 1, wherein said layer of said organic insulator further comprises a metallization ring built up therein.

* * * * *